(12) United States Patent
Kawahara et al.

(10) Patent No.: US 11,036,127 B2
(45) Date of Patent: Jun. 15, 2021

(54) REFLECTIVE MASK BLANK AND REFLECTIVE MASK

(71) Applicant: AGC INC., Chiyoda-ku (JP)

(72) Inventors: Hirotomo Kawahara, Tokyo (JP); Hiroshi Hanekawa, Tokyo (JP); Toshiyuki Uno, Tokyo (JP)

(73) Assignee: AGC INC., Chiyoda-ku (JP)

( * ) Notice: Subject to any disclaimer, the term of this patent is extended or adjusted under 35 U.S.C. 154(b) by 9 days.

(21) Appl. No.: 16/056,765

(22) Filed: Aug. 7, 2018

(65) Prior Publication Data

US 2019/0056653 A1 Feb. 21, 2019

(30) Foreign Application Priority Data

Aug. 15, 2017 (JP) .............................. JP2017-156756

(51) Int. Cl.
*G03F 1/24* (2012.01)
*G03F 1/38* (2012.01)
*G03F 1/40* (2012.01)
*G03F 1/48* (2012.01)
*G03F 1/52* (2012.01)
*G03F 1/54* (2012.01)

(52) U.S. Cl.
CPC .................. *G03F 1/40* (2013.01); *G03F 1/24* (2013.01); *G03F 1/38* (2013.01); *G03F 1/48* (2013.01); *G03F 1/52* (2013.01); *G03F 1/54* (2013.01)

(58) Field of Classification Search
CPC ..... G03F 1/24; G03F 1/48; G03F 1/40; G03F 1/38; G03F 1/52; G03F 1/54; G03F 1/22
See application file for complete search history.

(56) References Cited

U.S. PATENT DOCUMENTS

| 9,436,080 B2 | 9/2016 | Beyer et al. |
| 9,658,527 B2 | 5/2017 | Dmitriev |
| 2002/0076625 A1* | 6/2002 | Shoki .................. B82Y 10/00 430/5 |

(Continued)

FOREIGN PATENT DOCUMENTS

| JP | 2005-210093 | 8/2005 |
| JP | 2006-267595 | 10/2006 |

(Continued)

OTHER PUBLICATIONS

Machine translation of JP 2015-028999 (0215).*

*Primary Examiner* — Martin J Angebranndt
(74) *Attorney, Agent, or Firm* — Oblon, McClelland, Maier & Neustadt, L.L.P.

(57) ABSTRACT

A reflective mask blank includes a backside conductive film on a back surface of a substrate. The backside conductive film has a laminated structure including a stress compensation layer and a conductive layer in this order from the substrate side. The conductive layer includes a metal nitride. The stress compensation layer has a compressive stress and the stress compensation layer includes at least one compound selected from the group consisting of oxides, oxynitrides, and nitrides, each having an absorption coefficient (k) over the wavelength range of 400 nm to 800 nm being 0.1 or less. The conductive layer has a thickness of 5 nm or more and 30 nm or less. The backside conductive film has a total thickness of 50 nm or more.

9 Claims, 1 Drawing Sheet

(56) References Cited

U.S. PATENT DOCUMENTS

| | | | |
|---|---|---|---|
| 2005/0238922 A1* | 10/2005 | Kinoshita | B82Y 10/00 |
| | | | 428/698 |
| 2006/0240335 A1 | 10/2006 | Mitsui | |
| 2009/0253055 A1* | 10/2009 | Hayashi | B82Y 40/00 |
| | | | 430/5 |
| 2012/0154773 A1 | 6/2012 | Beyer | |
| 2014/0205936 A1 | 7/2014 | Kodera et al. | |
| 2015/0079501 A1* | 3/2015 | Shoki | G03F 1/24 |
| | | | 430/5 |
| 2016/0342080 A1 | 11/2016 | Beyer et al. | |
| 2018/0149962 A1* | 5/2018 | Kobayashi | G03F 1/54 |
| 2018/0356719 A1* | 12/2018 | Ikebe | G03F 1/48 |
| 2019/0384157 A1* | 12/2019 | Ikebe | G03F 1/24 |

FOREIGN PATENT DOCUMENTS

| | | | | |
|---|---|---|---|---|
| JP | 2012-049498 | * | 3/2012 | G03F 1/40 |
| JP | 2013-225662 | * | 10/2013 | G03F 1/24 |
| JP | 2015-028999 | | 2/2015 | |
| WO | WO 2013/046627 A1 | | 4/2013 | |
| WO | 2016/204051 | * | 12/2016 | G03F 1/40 |
| WO | 2018/159785 | * | 9/2018 | G03F 1/24 |

\* cited by examiner

REFLECTIVE MASK BLANK AND REFLECTIVE MASK

BACKGROUND OF THE INVENTION

Technical Field

The present invention relates to a reflective mask blank to be used in EUV (Extreme Ultra Violet) lithography used in semiconductor manufacturing or the like, and a reflective mask obtained by forming a pattern in an absorber layer of the reflective mask blank.

Background Art

In semiconductor industry, a photolithography method using visible light or ultraviolet light has been used as a fine pattern transfer technique necessary for forming an integrated circuit including a fine pattern on a Si substrate or the like. However, fining of semiconductor devices is accelerating, but a limit of a conventional photolithography method has been approached. In the photolithography method with single exposure, a resolution limit of a pattern is about ½ of an exposure wavelength, and it has been said that the resolution limit of the pattern is about ¼ of the exposure wavelength even when an immersion method is used, and the limit is expected to be about 45 nm even when an immersion method with ArF laser (193 nm) is used. Therefore, EUV lithography, which is an exposure technique using light in a EUV wavelength region of a wavelength shorter than ArF laser (hereinafter, referred to as EUV light), is promising as an exposure technique of 45 nm or less. In the specification, the EUV light refers to light of a wavelength in a soft X-ray region or a vacuum ultraviolet region, and specifically refers to light of a wavelength of about 10 nm to 20 nm, particularly about 13.5 nm±0.3 nm.

Since the EUV light is easy to be absorbed by many substances and a refractive index of the substance at the wavelength is close to 1, a refractive optical system such as photolithography using conventional visible light or ultraviolet light cannot be used. Therefore, in EUV optical lithography, a reflective optical system, that is, an EUV mask and a mirror are used.

A mask blank is a laminated body before patterning, which is used for manufacturing a photomask. A reflective mask blank has a structure in which a reflective layer which reflects EUV light and an absorber layer which absorbs EUV light are sequentially formed on/above a substrate such as glass.

A multilayer reflective film, in which a low-refractive-index layer with a low refractive index to the EUV light and a high-refractive-index layer with a high refractive index to the EUV light are alternately laminated so as to increase light reflectance when a layer surface is irradiated with the EUV light, is usually used as the reflective layer. A molybdenum (Mo) layer is usually used as the low-refractive-index layer of the multilayer reflective film, and a silicon (Si) layer is usually used as the high-refractive-index layer.

A material with a high absorption coefficient to the EUV light, specifically, for example, a material containing chromium (Cr) or tantalum (Ta) as a main component is used in the absorber layer.

The multilayer reflective film and the absorber layer are formed on/above an optical surface of a glass substrate by use of an ion beam sputtering method or a magnetron sputtering method. When forming the multilayer reflective film and the absorber layer, the glass substrate is held by support means. As support means of the glass substrate, there are mechanical chucks and electrostatic chucks, but it is preferable to use the electrostatic chuck from the standpoint of dust generation. The electrostatic chuck is also used as the support means of the glass substrate during a mask patterning process or mask handling in exposure.

The electrostatic chuck is a technique conventionally used as support means of a silicon (Si) wafer in a manufacturing process of a semiconductor device. Therefore, in a case of a substrate having a low dielectric constant and low conductivity such as a glass substrate, in order to obtain the same degree of chucking force as in a Si wafer, it is necessary to apply high voltage, which may cause a risk of dielectric breakdown.

In order to solve such a problem, Patent Literature 1 describes a multilayer reflective film substrate in which a conductive film (backside conductive film) is formed on the opposite side of the substrate from the multilayer reflective film to facilitate electrostatic chucking of the substrate, a reflective mask blank for exposure, and a mask for exposure. The conductive film is a metal nitride film, and as the metal, chromium, tantalum, molybdenum, and silicon are exemplified.

In the EUV mask and the reflective mask blank used therein, a technique which improves positional deviation of a pattern during transfer by locally irradiating a back surface of the EUV mask with a pulsed laser in a wavelength of 532 nm (any wavelength in a wavelength range of 400 nm to 800 nm may also be used) so as to locally heat the glass substrate, is being newly introduced.

However, when applying the technique, the backside conductive film is required to have high light transmittance at a wavelength of 532 nm (any wavelength in the wavelength range of 400 nm to 800 nm may also be used), specifically, the light transmittance in the wavelength region is required to be 10% or more (Patent Literature 2). Generally, in order to increase the light transmittance, a thickness may be reduced, but when the thickness of the backside conductive film is thin, a sheet resistance value thereof may increase and these requirements may not be satisfied.

Further, in the EUV mask and the reflective mask blank used therein, there may be a problem of substrate deformation caused by internal stress in the multilayer reflective film as the reflective layer, or the absorber layer.

Patent Literature 1: JP-A-2005-210093
Patent Literature 2: JP-A-2015-28999

SUMMARY OF THE INVENTION

In order to solve the above-mentioned problems of conventional techniques, an object of the present invention is to provide a reflective mask blank including a backside conductive layer and a mask blank, which have the following properties: light transmittance over the wavelength range of 400 nm to 800 nm is high; a sheet resistance value is low; and deformation of a substrate can be corrected by adjusting internal stress.

In order to achieve the above object, the present invention provides a reflective mask blank including a backside conductive film on a back surface of a substrate, wherein the backside conductive film has a laminated structure including a stress compensation layer and a conductive layer in this order from substrate side, wherein the conductive layer includes a metal nitride, wherein the stress compensation layer has a compressive stress, wherein the stress compensation layer includes at least one compound selected from the group consisting of oxides, oxynitrides, and nitrides, each having an absorption coefficient k over the wavelength range of 400 nm to 800 nm being 0.1 or less, wherein the conductive layer ha a thickness of 5 nm or more and 30 nm or less, and wherein the backside conductive film has a total thickness of 50 nm or more.

In the reflective mask blank of the present invention, it is preferable that the backside conductive film has a compressive stress with a total stress of 50 Pa·m to 400 Pa·m.

In the reflective mask blank of the present invention, it is preferable the stress compensation layer has a compressive stress with a film internal stress per unit film thickness of 300 MPa to 2,000 MPa.

In the reflective mask blank of the present invention, it is preferable that the stress compensation layer has a refractive index (n) over the wavelength range of 400 nm to 800 nm of 1.7 or more.

In the reflective mask blank of the present invention, it is preferable that the compound in the stress compensation layer includes at least one element selected from the group consisting of Sn, Ta, Zr, Zn, Ti, Nb, Si, and Al.

In the reflective mask blank of the present invention, it is preferable that metal nitride in the conductive layer includes at least one element selected from the group consisting of Cr, Ta, Ti, Zr and Nb.

In the reflective mask blank of the present invention, it is preferable that the conductive layer has a refractive index (n) at a wavelength of 532 nm of 3.5 or less and an absorption coefficient at a wavelength of 532 nm of 4.0 or less.

In the reflective mask blank of the present invention, it is preferable that the backside conductive film has a sheet resistance (Rs) of 250 Ω/square or less.

In the reflective mask blank of the present invention, it is preferable that the backside conductive film has transmittance over the wavelength range of 400 nm to 800 nm of 10% or more.

The reflective mask blank of the present invention preferably includes a reflective layer which reflects EUV light and an absorber layer which absorbs EUV light on/above a front surface of the substrate in this order from the substrate side.

In addition, the present invention provides a reflective mask obtained by forming a pattern in the absorber layer of the reflective mask blank.

In the reflective mask blank, since the light transmittance of the backside conductive film over the wavelength range of 400 nm to 800 nm is 10% or more, positional deviation of a pattern during transfer can be improved by locally irradiating a back surface of the EUV mask which is obtained by forming a pattern in the absorber layer with a pulsed laser in the wavelength region, so as to locally heat the glass substrate.

Further, since the sheet resistance of the backside conductive film is lowered to 250 Ω/square or less, sufficient holding force for a mask substrate can be obtained by an electrostatic chuck.

Further, the backside conductive film is a film having a compressive stress with a total stress of 50 Pa·m to 400 Pa·m, so that stress generated on a front surface side (a reflective layer side) of the substrate and stress generated on a back surface side of the substrate are canceled with each other, and as a result, deformation of the substrate caused by application of stress can be avoided.

DETAILED DESCRIPTION OF THE INVENTION

Hereinafter, a reflective mask blank of the present invention is described with reference to the drawings.

Figure 1:
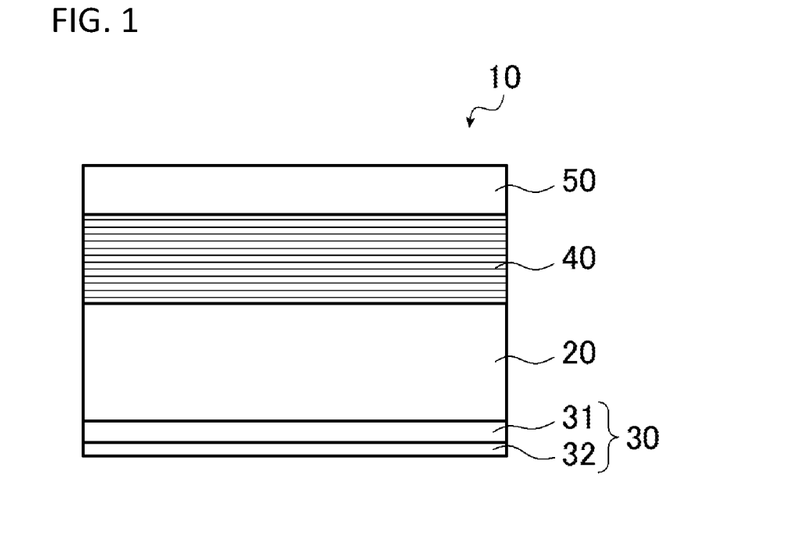
FIG. 1 is a schematic cross-sectional view of a reflective mask blank in one embodiment of the present invention.

FIG. 1 is a schematic cross-sectional view of a reflective mask blank in one embodiment of the present invention. In a reflective mask blank 10 shown in FIG. 1, a reflective layer 40 which reflects EUV light and an absorber layer 50 which absorbs EUV light are sequentially formed on/above an upper surface of a substrate 20. A backside conductive film 30 is formed on a backside of the substrate 20, that is, a lower surface of the substrate 20. The backside conductive film 30 has a laminated structure including a stress compensation layer 31 and a conductive layer 32 in this order from the lower surface side of the substrate 20.

Hereinafter, each constituent element of the mask blank is described.

The substrate 20 is required to satisfy properties as a substrate for a reflective mask blank. Therefore, it is preferable that the substrate 20 has a low coefficient of thermal expansion (specifically, the coefficient of thermal expansion at 20° C. is preferably 0±1.0×10$^{-7}$/° C., more preferably 0±0.3×10$^{-7}$/° C., still more preferably 0±0.2×10$^{-7}$/° C., further more preferably 0±0.1×10$^{-7}$/° C., and particularly preferably 0±0.05×10$^{-7}$/° C.), and has excellent smoothness, flatness, and resistance to a cleaning solution used for washing the mask blank or photomask after pattern formation. Specifically, glass having a low coefficient of thermal expansion, for example, $SiO_2$—$TiO_2$ based glass or the like is used as the substrate 20, but the present invention is not limited thereto, and crystallized glass which has a precipitated β-quartz solid solution, quartz glass, silicon or metal substrates can also be used.

It is preferable that the substrate 20 has a smooth surface with a surface roughness (rms) of 0.15 nm or less in the standard of JIS-B 0601-2001 and flatness of 100 nm or less, so that high reflectance to EUV light and transfer accuracy in the photomask after pattern formation is obtained.

A size, thickness or the like of the substrate 20 are determined appropriately depending on design values of the mask or the like. In Examples described later, $SiO_2$—$TiO_2$ based glass having a 6 inches (152 mm) square in outer dimensions and a thickness of 0.25 inch (6.3 mm) was used.

It is preferable to have no defect on a surface of the substrate 20 on the side where the reflective layer 40 is formed. However, even in a case where there are defects, in order to prevent occurrence of a phase defect due to a concave defect and/or a convex defect, it is preferable that a depth of the concave defect and a height of the convex defect are 2 nm or less, and a full width at half maximum of the concave defect and convex defect is 60 nm or less.

The reflective layer 40 is required to have high reflectance of EUV light as a reflective layer of the reflective mask blank. Specifically, when a surface of the reflective layer 40 is irradiated with the EUV light at an incident angle of 6 degrees, a maximum value of the light reflectance around a wavelength of 13.5 nm is preferably 60% or more, more preferably 63% or more, and still more preferably 65% or more.

Since the reflective layer 40 can have high reflectance of EUV light, a multilayer reflective film in which a high-refractive-index layer with a high refractive index to the EUV light and a low-refractive-index layer with a low refractive index to the EUV light are alternately laminated, is usually used. In the multilayer reflective film serving as the reflective layer 40, Si is widely used in the high-refractive-index layer, and Mo is widely used in the low-refractive-index layer. That is, a Mo/Si multilayer reflective film is the most commonly used. However, the multilayer reflective film is not limited thereto, and a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film and a Si/Ru/Mo/Ru multilayer reflective film can also be used.

A thickness of each layer constituting the multilayer reflective film serving as the reflective layer 40 and a number of repeating units of the layer can be selected appropriately depending on a film material used and the EUV light reflectance required for the multilayer reflective film. Taking a Mo/Si multilayer reflective film as an example, in order to obtain the reflective layer 40 with the maximum reflectance of EUV light of 60% or more, a Mo layer having a thickness of 2.3±0.1 nm and a Si layer having a thickness of 4.5±0.1 nm may be laminated such that a number of repeating units is 30 to 60.

Each layer constituting the reflective layer 40 may be formed to have a desired thickness by use of known deposition methods such as a magnetron sputtering method and an ion beam sputtering method. For example, in a case of forming a Mo/Si multilayer reflective film by use of an ion beam sputtering method, it is preferable that a Si film is form to have a thickness of 4.5 nm by using a Si target as a target, and using Ar gas as sputtering gas (gas pressure: $1.3 \times 10^{-2}$ Pa to $2.7 \times 10^{-2}$ Pa) at an ion acceleration voltage of 300 V to 1,500 V and a deposition rate of 0.03 nm/sec to 0.30 nm/sec, and then, a Mo film is formed to have a thickness of 2.3 nm by using a Mo target as a target, and using Ar gas as sputtering gas (gas pressure: $1.3 \times 10^{-2}$ Pa to $2.7 \times 10^{-2}$ Pa) at an ion acceleration voltage of 300 V to 1,500 V and a deposition rate of 0.03 nm/sec to 0.30 nm/sec. When the above formation procedure is taken as one cycle, the Mo/Si multilayer reflective film is formed by laminating the Si film and the Mo film in 30 to 60 cycles.

The absorber layer 50 is particularly required to have an extremely low reflectance of EUV light. Specifically, when a surface of the absorber layer 50 is irradiated with light in a wavelength region of EUV light, the maximum light reflectance around a wavelength of 13.5 nm is preferably 5% or less, more preferably 3% or less, and particularly preferably 1% or less.

In order to achieve the above property, the absorber layer 50 is formed of a material with a high absorption coefficient of EUV light. It is preferable to use a material containing tantalum (Ta) as a main component as the material having a high absorption coefficient of EUV light. In the specification, when referring to a material containing tantalum (Ta) as a main component, it means a material containing 20 at % or more of Ta in the material. The absorber layer 50 contains preferably 30 at % or more of Ta, more preferably 35 at % or more of Ta, still more preferably 40 at % or more of Ta, further more preferably 45 at % or more of Ta, and particularly preferably 50 at % or more of Ta.

The material containing Ta as the main component and used in the absorber layer 50 preferably contains, in addition to the Ta, at least one component selected from hafnium (Hf), silicon (Si), zirconium (Zr), germanium (Ge), boron (B), palladium (Pd), tin (Sn), chromium (Cr), manganese (Mn), iron (Fe), cobalt (Co), silver (Ag), cadmium (Cd), indium (In), antimony (Sb), tungsten (W), rhenium (Re), Osmium (Os), iridium (Ir), platinum (Pt), gold (Au), thallium (Tl), lead (Pb), bismuth (Bi), carbon (C), titanium (Ti), zirconium (Zr), molybdenum (Mo), ruthenium (Ru), rhodium (Rh), palladium (Pd), calcium (Ca), magnesium (Mg), aluminum (Al), nickel (Ni), copper (Cu), zinc (Zn), gallium (Ga), arsenic (As), selenium (Se), tellurium (Te), hydrogen (H) and Nitrogen (N). Specific examples of the material containing the above elements in addition to the Ta include, for example, TaN, TaNH, TaHf, TaHfN, TaBSi, TaBSiN, TaB, TaBN, TaSi, TaSiN, TaGe, TaGeN, TaZr, TaZrN, TaPd, TaSn, TaPdN, TaSn, TaCr, TaMn, TaFe, TaCo, TaAg, TaCd, Tan, TaSb, TaW, or the like.

The absorber layer 50 having the above constitution can be formed by use of deposition methods such as sputtering methods, for example, the magnetron sputtering method and the ion beam sputtering method.

For example, in a case of forming a TaNH film as the absorber layer 50 by use of a magnetron sputtering method, it is preferable that a film is formed to have a thickness of 20 nm to 90 nm by using a Ta target as a target, and using mixed gas of Ar, $N_2$ and $H_2$ as sputtering gas ($H_2$ gas concentration: 1 vol % to 30 vol %, $N_2$ gas concentration: 5 vol % to 75 vol %, Ar gas concentration: 10 vol % to 94 vol %, gas pressure: $0.5 \times 10^{-1}$ Pa to 1.0 Pa) at an input power of 300 W to 2,000 W and a deposition rate of 0.5 nm/min to 60 nm/min.

Examples of properties required for the backside conductive film 30 include a low sheet resistance value. The sheet resistance value of the backside conductive film 30 is preferably 250 Ω/square or less, more preferably 150 Ω/square or less, still more preferably 100 Ω/square or less.

Further, examples of the properties required for the backside conductive film 30 include high light transmittance over the wavelength range of 400 nm to 800 nm. This is because the positional deviation of the patterns during transfer can be improved by locally irradiating with a pulsed laser in the wavelength range. The light transmittance of the backside conductive film 30 over the wavelength range of 400 nm to 800 nm is preferably 10% or more, more preferably 15% or more, still more preferably 20% or more. In addition, the light transmittance of the backside conductive film 30 over the wavelength range of 400 nm to 800 nm is preferably 60% or less.

Further, examples of the properties required for the backside conductive film 30 include a film having a compressive stress. This is because stress generated on a front surface side (a reflective layer side) of the substrate and stress generated on a back surface side of the substrate are canceled with each other, and as a result, deformation of the substrate caused by application of stress can be avoided. The backside conductive film 30 is preferably a film having a compressive stress with a total stress of 50 Pa·m to 400 Pa·m, more preferably a film having a compressive stress with a total stress of 100 Pa·m to 300 Pa·m, and still more preferably a film having a compressive stress with a total stress of 150 Pa·m to 250 Pa·m.

As described above, the backside conductive film 30 has a laminated structure including the stress compensation layer 31 and the conductive layer 32 in this order from the lower surface side of the substrate 20. Among the properties required for the above backside conductive film 30, the conductive layer 32 is mainly responsible for the required property associated with the sheet resistance value. Meanwhile, the stress compensation layer 31 is mainly responsible for the compressive stress. The conductive layer 32 and the stress compensation layer 31 contribute to the light transmittance over the wavelength range of 400 nm to 800 nm, and a contribution ratio for the light transmittance depends on film thicknesses thereof.

In order to achieve the above required properties, the conductive layer 32 is formed of a material containing a metal nitride. It is preferable that the conductive layer 32 is formed of a metal nitride containing at least one element selected from the group consisting of Cr, Ta, Ti, Zr, and Nb. Specific examples of the conductive layer 32 include a CrN film, a TaN film, a CrTaN film, a TiN film, and a ZrN film.

Among the films, the CrN film is preferable from the standpoint that it is highly resistant to chemicals such as alkali and acid, which is used for general mask blank cleaning and mask cleaning.

In order to achieve the above required properties, the stress compensation layer 31 has a compressive stress. The stress compensation layer 31 preferably has a compress stress having a film internal stress per unit film thickness of 300 MPa to 2,000 MPa, and more preferably has a compressive stress with a film internal stress per unit film thickness of 500 MPa to 1,500 MPa.

Further, the stress compensation layer 31 is formed of a material having an absorption coefficient (k) over the wavelength range of 400 nm to 800 nm of 0.1 or less. In the stress compensation layer 31, the absorption coefficient k over the wavelength range of 400 nm to 800 nm is preferably 0.05 or less, and more preferably 0.02 or less. In addition, the smaller absorption coefficient k over the wavelength range of 400 nm to 800 nm is preferable, and the preferable lower limit thereof is 0.

Further, the stress compensation layer 31 contains at least one compound selected from the group consisting of oxides, oxynitrides, and nitrides, each having an absorption coefficient (k) over the wavelength range of 400 nm to 800 nm, the absorption coefficient k satisfying the above range.

Further, in the stress compensation layer 31, a refractive index (n) over the wavelength range of 400 nm to 800 nm is preferably 1.7 or more, more preferably 2.0 or more, and still more preferably 2.2 or more. In addition, the refractive index (n) over the wavelength range of 400 nm to 800 nm is preferably 4.0 or less.

Further, it is preferable that the stress compensation layer 31 contains at least one element selected from the group consisting of Sn, Ta, Zr, Zn, Ti, Nb, Si, and Al. Specific examples of the stress compensation layer 31 include a SnON film, a TaON film, a $ZrO_2$ film, and a SiON film.

Among the films, the SnON film is preferable from the standpoint that the above compressive stress can be achieved with a small film thickness and a deposition rate during the deposition by the sputtering method is high.

In the stress compensation layer 31, the absorption coefficient (k) over the wavelength range of 400 nm to 800 nm and the refractive index (n) over the wavelength range of 400 nm to 800 nm are required to fall within the above range, from the standpoint of increasing the light transmittance over the wavelength range of 400 to 800 nm. For the same reason, it is preferable that the refractive index (n) and the absorption coefficient (k) of the conductive layer 32 at a wavelength of 532 nm satisfy the following conditions.

In the conductive layer 32, the refractive index (n) at the wavelength of 532 nm is preferably 3.5 or less, more preferably 3.0 or less, and still more preferably 2.5 or less. In addition, the refractive index (n) at the wavelength of 532 nm is preferably 0.5 or more.

In the conductive layer 32, the absorption coefficient (k) at the wavelength of 532 nm is preferably 4.0 or less, more preferably 3.0 or less, and still more preferably 2.5 or less. In addition, the absorption coefficient (k) at the wavelength of 532 nm is preferably 0.5 or more.

In order to achieve the above required properties, the backside conductive film 30 has a total thickness of 50 nm or more, preferably 100 nm or more and 600 nm or less, and more preferably 140 nm or more and 350 nm or less.

Further, the conductive layer 32 has a thickness of 5 nm or more and 30 nm or less, preferably 10 nm or more and 20 nm or less, and more preferably 12 nm or more and 18 nm or less.

Further, the thickness of the stress compensation layer 31 is not particularly limited, and is selected appropriately depending on the total thickness of the backside conductive film 30 and the thickness of the conductive layer 32.

It is preferable that a surface roughness (rms) of the backside conductive film 30 is 0.5 nm or less. When the surface roughness of the backside conductive film 30 is large, the light transmittance may be lowered due to light scattering. When the surface roughness (rms) of the backside conductive film 30 is 0.5 nm or less, the light scattering is reduced and the light transmittance over the wavelength range of 400 nm to 800 nm can be 10% or more, and from such a standpoint, the surface roughness of 0.5 nm or less is preferred.

Further, when the surface roughness (rms) of the backside conductive film 30 is 0.5 nm or less, the conductive film is excellent in surface smoothness, so that the above surface roughness is preferred from the standpoint of prevention of film peeling during electrostatic chucking.

The surface roughness (rms) of the backside conductive film 30 is more preferably 0.4 nm or less, and still more preferably 0.3 nm or less. The surface roughness (rms) can be evaluated based on the standard of JIS-B0601-2001.

The stress compensation layer 31 can be formed by known deposition methods, for example, sputtering methods, such as the magnetron sputtering method and the ion beam sputtering method.

In a case where the stress compensation layer 31 is a SnON film, the stress compensation layer 31 can be formed by performing a sputtering method, for example, the magnetron sputtering method or the ion beam sputtering method, by using an Sn target in an atmosphere of oxygen ($O_2$) and nitrogen ($N_2$), diluted with inert gas containing at least one of helium (He), argon (Ar), neon (Ne), krypton (Kr) and xenon (Xe). Alternately, the SnON film may be formed as follows: the Sn target is discharged in an atmosphere of nitrogen ($N_2$) diluted with inert gas containing at least one of helium (He), argon (Ar), neon (Ne), krypton (Kr) and xenon (Xe) to form a SnN film, and then, for example, the SnN film is exposed to oxygen plasma or is irradiated with an ion beam using oxygen, thereby oxidizing the formed film to form the SnON film.

In a case where the stress compensation layer 31 is a TaON film, the stress compensation layer 31 can be formed by performing a sputtering method, for example, the magnetron sputtering method or the ion beam sputtering method, by using a Ta target in an atmosphere of oxygen ($O_2$) and nitrogen ($N_2$), diluted with inert gas containing at least one of helium (He), argon (Ar), neon (Ne), krypton (Kr) and xenon (Xe). Alternately, the TaON film may be formed as follows: the Ta target is discharged in an atmosphere of nitrogen (N$_2$) diluted with inert gas containing at least one of helium (He), argon (Ar), neon (Ne), krypton (Kr) and xenon (Xe) to form a TaN film, and then, for example, the TaN film is exposed to oxygen plasma or is irradiated with an ion beam using oxygen, thereby oxidizing the formed film to form the TaON film.

In a case where the stress compensation layer 31 is a ZrO$_2$ film, the stress compensation layer 31 is formed by discharging a Zr target in an atmosphere of oxygen (O$_2$) diluted with inert gas containing at least one of helium (He), argon (Ar), neon (Ne), krypton (Kr), and xenon (Xe).

In a case where the stress compensation layer 31 is a SiON film, the stress compensation layer 31 can be formed by performing a sputtering method, for example, the magnetron sputtering method or the ion beam sputtering method, by using an Si target in an atmosphere of oxygen (O$_2$) and nitrogen (N$_2$), diluted with inert gas containing at least one of helium (He), argon (Ar), neon (Ne), krypton (Kr) and xenon (Xe). Alternately, the SiON film may be formed as follows: the Si target is discharged in an atmosphere of nitrogen (N$_2$) diluted with inert gas containing at least one of helium (He), argon (Ar), neon (Ne), krypton (Kr) and xenon (Xe) to form a SiN film, and then, for example, the SiN film is exposed to oxygen plasma or is irradiated with an ion beam using oxygen, thereby oxidizing the formed film to form the SiON film.

In order to form the stress compensation layer 31 by the method described above, specifically, the method may be performed under the following deposition conditions.

(In a case of forming the ZrO$_2$ film)

Sputtering Gas: mixed gas of Ar and O$_2$ (O$_2$ gas concentration: 3 vol % to 80 vol %, preferably 5 vol % to 60 vol %, and more preferably 10 vol % to 40 vol %; gas pressure: $1.0\times10^{-1}$ Pa to $50\times10^{-1}$ Pa, preferably $1.0\times10^{-1}$ Pa to $40\times10^{-1}$ Pa, and more preferably $1.0\times10^{-1}$ Pa to $30\times10^{-1}$ Pa)

Input Power: 30 W to 1,000 W, preferably 50 W to 750 W, and more preferably 80 W to 500 W Deposition Rate: 0.01 nm/min to 60 nm/min, preferably 0.05 nm/min to 45 nm/min, and more preferably 0.1 nm/min to 30 nm/min (In a case of forming the SnON film, the TaON film and the SiON film)

Sputtering Gas: mixed gas of Ar, O$_2$ and N$_2$ (O$_2$ gas concentration: 5 vol % to 95 vol %, N$_2$ gas concentration: 5 vol % to 75 vol %, preferably O$_2$ gas concentration: 6 vol % to 70 vol %, N$_2$ gas concentration: 6 vol % to 35 vol %, and more preferably O$_2$ gas concentration: 10 vol % to 30 vol %, N$_2$ gas concentration: 10 vol % to 30 vol %; Ar gas concentration: 0 vol % to 90 vol %, preferably 10 vol % to 88 vol %, and more preferably 20 vol % to 80 vol %; gas pressure: $1.0\times10^{-1}$ Pa to $50\times10^{-1}$ Pa, preferably $1.0\times10^{-1}$ Pa to $40\times10^{-1}$ Pa, and more preferably $1.0\times10^{-1}$ Pa to $30\times10^{-1}$ Pa)

Input Power: 30 W to 1,000 W, preferably 50 W to 750 W, and more preferably 80 W to 500 W Deposition Rate: 0.01 nm/min to 60 nm/min, preferably 0.05 nm/min to 45 nm/min, and more preferably 0.1 nm/min to 30 nm/min In a case where inert gas other than Ar is used, a concentration of the inert gas is set to the same concentration range as the above Ar gas concentration. Further, in a case where multiple types of inert gas are used, a total concentration of the inert gas is set to the same concentration range as the above Ar gas concentration.

The conductive layer 32 in the present invention can be formed by known deposition methods, for example, sputtering methods, such as the magnetron sputtering method and the ion beam sputtering method. In a case where the CrN film, the TaN film or the CrTaN film is formed as the conductive layer 32 by a sputtering method, the sputtering method may be performed by using a Cr target and/or a Ta target in an atmosphere containing nitrogen (N$_2$) and inert gas containing at least one of helium (He), argon (Ar), neon (Ne), krypton (Kr), and xenon (Xe).

In addition, in a case where the TiN film or the ZrN film is formed as the conductive layer 32 by a sputtering method, the sputtering method may be performed by using a Ti target or a Zr target in an atmosphere containing nitrogen (N$_2$) and inert gas containing at least one of helium (He), argon (Ar), neon (Ne), krypton (Kr), and xenon (Xe).

In order to form the conductive layer 32 by the magnetron sputtering method, specifically, the method may be performed under the following deposition conditions.

(In a case of forming the CrN film)

Target: Cr target

Sputtering Gas: mixed gas of Ar and N$_2$ (N$_2$ gas concentration: 3 vol % to 45 vol %, preferably 5 vol % to 40 vol %, and more preferably 10 vol % to 35 vol %; gas pressure: $1.0\times10^{-1}$ Pa to $50\times10^{-1}$ Pa, preferably $1.0\times10^{-1}$ Pa to $40\times10^{-1}$ Pa, and more preferably $1.0\times10^{-1}$ Pa to $30\times10^{-1}$ Pa)

Input Power: 30 W to 1,000 W, preferably 50 W to 750 W, and more preferably 80 W to 500 W Deposition Rate: 2.0 nm/min to 60 nm/min, preferably 3.5 nm/min to 45 nm/min, and more preferably 5 nm/min to 30 nm/min (In a case of forming the TaN film)

Target: Ta target

Sputtering Gas: mixed gas of Ar and N$_2$ (N$_2$ gas concentration: 3 vol % to 45 vol %, preferably 5 vol % to 40 vol %, and more preferably 10 vol % to 35 vol %; gas pressure: $1.0\times10^{-1}$ Pa to $50\times10^{-1}$ Pa, preferably $1.0\times10^{-1}$ Pa to $40\times10^{-1}$ Pa, and more preferably $1.0\times10^{-1}$ Pa to $30\times10^{-1}$ Pa)

Input Power: 30 W to 1,000 W, preferably 50 W to 750 W, and more preferably 80 W to 500 W Deposition Rate: 2.0 nm/min to 60 nm/min, preferably 3.5 nm/min to 45 nm/min, and more preferably 5 nm/min to 30 nm/min The reflective mask blank 10 may have a constitution other than the constitutions shown in FIG. 1, that is, the substrate 20, the stress compensation layer 31, the conductive layer 32, the reflective layer 40, and the absorber layer 50.

In the reflective mask blank, a protective layer may be formed between the reflective layer 40 and the absorber layer 50. The protective layer is provided for the purpose of protecting the reflective layer 40 such that the reflective layer 40 is not damaged by etching when the absorber layer 50 is etched (usually dry etched) to form a mask pattern in the absorber layer 50. Therefore, a substance which is difficult to be affected by the etching of the absorber layer 50, that is, a substance in which an etching rate thereof is smaller than that of the absorber layer 50, and which is difficult to be damaged by the etching, is selected as a material of the protective layer. Examples of the substance satisfying the requirements include, for example, Cr, Al, Ta and nitrides thereof, Ru and Ru compounds (RuB, RuSi, and the like), SiO$_2$, Si$_3$N$_4$, Al$_2$O$_3$ and mixtures thereof. Among the above examples, Ru and Ru compounds (RuB, RuSi, and the like), CrN and SiO$_2$ are preferable, and Ru and Ru compounds (RuB, RuSi, and the like) are particularly preferable.

Further, in a case of forming the protective layer, a thickness thereof is preferably 1 nm to 60 nm, and more preferably 1 nm to 40 nm.

In a case of forming the protective layer, the protective layer is formed by use of known deposition methods such as the magnetron sputtering method and the ion beam sputtering method. In a case of forming a Ru film by the magnetron sputtering method, it is preferable that the film is formed to have a thickness of 2 nm to 5 nm by using a Ru target as a target, and using Ar gas as sputtering gas (gas pressure: $1.0 \times 10^{-2}$ Pa to $10 \times 10^{-1}$ Pa) at an input power of 30 W to 1,500 W and a deposition rate of 1.2 nm/min to 60 nm/min.

Even in a case where the protective layer is placed on the reflective layer 40, the maximum value of the light reflectance around a wavelength of 13.5 nm is preferably 60% or more, more preferably 63% or more, and still more preferably 65% or more.

Further, in the reflective mask blank, a low reflective layer to inspection light used for inspecting a mask pattern may be formed on the absorber layer 50.

The low reflective layer is constituted by a film with low reflection to the inspection light used for inspection of the mask pattern. When manufacturing the EUV mask, a pattern is formed in the absorber layer, and it is inspected whether the pattern is formed as designed or not. In the inspection of the mask pattern, an inspection machine using light having a wavelength of about 257 nm as the inspection light is usually used. That is, the mask pattern is inspected by a difference in reflectance of light having a wavelength of about 257 nm, that is a difference in reflectance between a surface of the absorber layer exposed by being removed due to pattern formation and a surface of the absorber layer remained without being removed by pattern formation. Here, the former is a surface of the reflective layer or a surface of the protective layer, and is usually the surface of the protective layer. Therefore, when the difference in reflectance to a wavelength of the inspection light between the surface of the reflective layer or surface of the protective layer and the surface of the absorber layer is small, contrast during inspection becomes worse and accurate inspection cannot be performed. In a case where the difference in reflectance to the wavelength of the inspection light between the surface of the reflective layer or surface of the protective layer and the surface of the absorber layer is small, the contrast during inspection becomes good by forming the low reflective layer. In a case of forming the low reflective layer on the absorber layer, when a surface of the low reflective layer is irradiated with light in a wavelength region of the inspection light, the maximum reflectance of the low reflective layer at the wavelength of the inspection light is preferably 15% or less, more preferably 10% or less, and still more preferably 5% or less.

In order to achieve the above properties, the low reflective layer is formed of a material with a refractive index at the wavelength of the inspection light lower than that of the absorber layer.

The low reflective layer satisfying the property contains at least one element selected from the group consisting of tantalum (Ta), palladium (Pd), chromium (Cr), silicon (Si), hafnium (Hf) and at least one element selected from the group consisting of oxygen (O) and nitrogen (N). Preferable examples of the low reflective layer include a TaPdO layer, a TaPdON layer, a TaON layer, a CrO layer, a CrON layer, a SiON layer, a SiN layer, an HfO layer, and an HfON layer.

It is preferable that a total content of Ta, Pd, Cr, Si and Hf in the low reflective layer is 10 at % to 55 at %, particularly 10 at % to 50 at %, from the standpoint that optical properties of the pattern inspection light to the wavelength region thereof can be controlled.

Further, it is preferable that a total content of O and N in the low reflective layer is 45 at % to 90 at %, particularly 50 at % to 90 at %, from the standpoint that the optical properties of the pattern inspection light to the wavelength region thereof can be controlled. The total content of Ta, Pd, Cr, Si, Hf, O, and N in the low reflective layer is preferably 95 at % to 100 at %, and more preferably 97 at % to 100 at %, and still more preferably 99 at % to 100 at %.

The low reflective layer having the above constitution can be formed by performing a sputtering method by using a target containing at least one of Ta, Pd, Cr, Si, and Hf. Here, any of the above two or more kinds of metal targets and a compound target can be used as the target.

The use of two or more kinds of metal targets is convenient for adjusting components of the low reflective layer. In a case of using two or more kinds of metal targets, the constituent components of the absorber layer can be adjusted by adjusting the input power to the target. Meanwhile, in a case where the compound target is used, it is preferable to previously adjust a target composition so as to allow the formed low reflective layer to have a desired composition.

The sputtering method using the above target can be performed in an inert gas atmosphere similarly with the sputtering method aimed at forming the absorber layer.

However, in a case where the low reflective layer contains oxygen (O), the sputtering method is performed in an atmosphere of inert gas containing $O_2$ and at least one of He, Ar, Ne, Kr and Xe. In a case where the low reflective layer contains N, the sputtering method is performed in an atmosphere of inert gas containing $N_2$ and at least one of He, Ar, Ne, Kr and Xe. In a case where the low reflective layer contains O and N, the sputtering method is performed in an atmosphere of inert gas containing $O_2$ and $N_2$ and at least one of He, Ar, Ne, Kr and Xe.

Specific conditions for performing the sputtering method are different depending on the target to be used and compositions of the inert gas atmosphere in which the sputtering method is performed, but in all cases, the sputtering method may be performed under the following conditions.

The deposition conditions for the low reflective layer are shown below taking the case where the inert gas atmosphere is an atmosphere of mixed gas of Ar and $O_2$ as an example.
(Deposition Conditions for the Low Reflective Layer)

Gas Pressure: $1.0 \times 10^{-1}$ Pa to $50 \times 10^{-1}$ Pa, preferably $1.0 \times 10^{-1}$ Pa to $40 \times 10^{-1}$ Pa, and more preferably $1.0 \times 10^{-1}$ Pa to $30 \times 10^{-1}$ Pa Sputtering Gas: mixed gas of Ar and $O_2$ ($O_2$ gas concentration: 3 vol % to 80 vol %, preferably 5 vol % to 60 vol %, and more preferably 10 vol % to 40 vol %)

Input Power: 30 W to 1,000 W, preferably 50 W to 750 W, and more preferably 80 W to 500 W Deposition Rate: 0.01 nm/min to 60 nm/min, preferably 0.05 nm/min to 45 nm/min, and more preferably 0.1 nm/min to 30 nm/min.

In a case where inert gas other than Ar or plural kinds of inert gas are used, a concentration of the inert gas is set to the same concentration range as the above Ar gas concentration. Further, in a case where the inert gas atmosphere contains $N_2$, the $N_2$ concentration is set to the same concentration range as the above oxygen concentration, and in a case where the inert gas atmosphere contains $N_2$ and $O_2$, the total concentration of the $N_2$ and $O_2$ is set to the same concentration range as the above oxygen concentration.

In the reflective mask blank, it is preferable that the low reflective layer is formed on the absorber layer, from the standpoint that the wavelength of the inspection light for the pattern is different from the wavelength of the EUV light.

Therefore, in a case where the EUV light (around 13.5 nm) is used as the inspection light of the pattern, it is considered unnecessary to form the low reflective layer on the absorber layer. The wavelength of the inspection light tends to shift toward a shorter wavelength side as the pattern dimension decreases, and it is considered that the wavelength may be shifted to 193 nm and further to 13.5 nm in the future. In a case where the wavelength of the inspection light is 13.5 nm, it is considered necessary to form the low reflective layer on the absorber layer.

In the reflective mask blank, a hard mask layer described in JP-A-2009-54899 and JP-A-2009-21582, that is, a layer of a material having resistance to etching conditions of the absorber layer (the absorber layer and the low reflective layer in a case where the low reflective layer is formed on the absorber layer) may be formed on the absorber layer (on the absorber layer in a case where the low reflective layer is formed on the absorber layer). Such a hard mask layer is formed and etching selectivity between the absorber layer (the absorber layer and the low reflective layer in a case where the low reflective layer is formed on the absorber layer) and the hard mask layer under the etching conditions of the absorber layer (the absorber layer and the low reflective layer in a case where the low reflective layer is formed on the absorber layer), specifically a ratio of an etching rate of the absorber layer (an etching rate of the absorber layer and the low reflective layer in a case where the low reflective layer is formed on the absorber layer) and an etching rate of the hard mask layer under the etching conditions of the absorber layer (the absorber layer and the low reflective layer in a case where the low reflective layer is formed on the absorber layer) is increased, so that resist can be thinned.

EXAMPLES

Hereinafter, the present invention is described by way of specific examples, but the present invention is not limited to these examples. Cases 1 to 3 are comparative examples, and Cases 4 to 7 are working examples.

(Case 1)

In this Case 1, the conductive layer 32 was formed without forming the stress compensation layer 31 on one surface side of the substrate 20.

A SiO$_2$—TiO$_2$ based glass substrate (6 inches (about 152 mm) square in outer dimensions, and 6.3 mm thick) was used as the substrate 20 for the deposition. The glass substrate has a coefficient of thermal expansion of 0.05× 10$^{-7}$/° C. at 20° C., a Young's modulus of 67 GPa, a Poisson's ratio of 0.17, and a specific rigidity of 3.07×10$^7$ m$^2$/s$^2$. The glass substrate is polished to form a smooth surface with a surface roughness (rms) of 0.15 nm or less and flatness of 100 nm or less.

A CrN film was formed as a conductive layer 32 on one surface side of the substrate 20 by use of a magnetron sputtering method. The deposition conditions for the conductive layer 32 (CrN film) are as follows.

Target: Cr target
Sputtering Gas: mixed gas of Ar and N$_2$ (gas flow (Ar/N$_2$): 21/20 (sccm), gas pressure: 0.23 Pa)
Input Power: 1,000 W
Deposition Rate: 0.121 nm/sec
Film Thickness: 345 nm (Refractive Index (n) and Absorption Coefficient (k) over the Wavelength Range of 400 nm to 800 nm)

With respect to the formed conductive layer 32 (CrN film), a refractive index (n) and an absorption coefficient (k) over the wavelength range of 400 nm to 800 nm were obtained by use of a spectroscopic ellipsometer (manufacturer: J.A. Woollam Company, model: M2000-DI). The light entered from a surface on the side where the conductive layer 32 was formed, and a polarization state was measured and analyzed to calculate the refractive index (n) and the absorption coefficient (k) over the wavelength range of 400 nm to 800 nm. The result is shown in Table 1.

(Light Transmittance over the Wavelength Range of 400 nm to 800 nm)

With respect to the substrate 20 on which the conductive layer 32 (CrN film) was formed, light entered vertically from a surface on the side where the conductive layer 32 was formed, light transmittance over the wavelength range of 175 nm to 1000 nm was measured by use of a spectrophotometer (manufacturer: Hitachi High-Technologies Corporation, model: U-4100) and the light transmittance over the wavelength range of 400 to 800 nm was obtained. The result is shown in Table 1.

(Sheet Resistance Value)

The sheet resistance value of the conductive layer 32 (CrN film) was measured by use of a four-probe measuring device (manufacturer: Mitsubishi Chemical Analytech Corporation, model: Loresta-GX MCP-T700). The sheet resistance value is shown in Table 2.

(Film Stress and Film Stress per Unit Film Thickness)

A CrN film was formed as the conductive layer 32 on a 4-inch silicon wafer in the same procedure as described above, and the stress of the conductive layer 32 was evaluated in the following procedures by use of a stress measuring device (manufacturer: KLA tencor, model: FLX2320S).

Change in an amount of warpage (radius of curvature) of the substrate before and after deposition was measured with the above measuring device, the stress of the conductive layer 32 was calculated from Stony equation (the following equation), and further, the stress per unit film thickness was obtained by dividing the stress by a thickness of the conductive layer 32. Further, a total stress was obtained by multiplying the thickness of the conductive layer 32.

$$\sigma_A = \sigma \times t_F = E_s t_s^2 / 6(1-v_s) R \quad \text{(Stony equation)}$$

In the Stony equation, $\sigma_A$ is the stress (total stress) of the conductive layer 32 on the back surface thereof, $\sigma$ is the stress per unit film thickness of the conductive layer 32 on the back surface thereof, $E_s$ is the Young's modulus of the substrate 20, $t_s$ is the thickness of the substrate 20, $v_s$ is the Poisson's ratio of the substrate 20, R is the radius of curvature of the substrate 20, and $t_F$ is the thickness of the conductive layer 32.

In a case where the stress a obtained by the above procedures is a negative value, the stress is a compressive stress, and in a case where the stress as is a positive value, the stress is tensile stress.

The total stress of the conductive layer 32 was −207.0 Pa·m, and the stress per unit film thickness was −600 MPa.

(Flatness of Reflective Mask Blank (Flatness of Substrate with Reflective Layer))

Using the conductive layer 32, the substrate 20 was fixed to a usual electrostatic chuck having a plate shape, a Si film and a Mo film were formed alternately on/above the other surface of the substrate 20 repeatedly in 40 cycles by use of an ion beam sputtering method, thereby forming a Mo/Si multilayer reflective film (reflective layer 40) having a total thickness of 272 nm ((4.5 nm+2.3 nm)×40), and thus, the substrate with a reflective layer was manufactured.

The deposition conditions for the Si film and the Mo film are as follows.

(Deposition Conditions for the Si Film)
  Target: Si target (boron doped)
  Sputtering Gas: Ar gas (gas pressure: 0.02 Pa)
  Voltage: 700 V
  Deposition Rate: 0.077 nm/sec
  Film Thickness: 4.5 nm
(Deposition Conditions for the Mo Film)
  Target: Mo target
  Sputtering Gas: Ar gas (gas pressure: 0.02 Pa)
  Voltage: 700 V
  Deposition Rate: 0.064 nm/sec Next, a protective layer was formed on the reflective layer by the ion beam sputtering method.

The protective layer was a Ru layer, and the ion beam sputtering was performed by using a Ru target under an Ar gas atmosphere (gas pressure: 0.02 Pa). An applied voltage was set to 700 V, and a deposition rate was set to 3.12 nm/min. A thickness of the protective layer was set to 2.5 nm.

Next, an absorber layer was formed on the protective layer by the magnetron sputtering method.

The absorber layer was a TaN layer, and the magnetron sputtering was performed by using a Ta target under an atmosphere of mixed gas of Kr and $N_2$ (Kr=95 vol %, and $N_2$=5 vol %). A deposition rate was set to 7.7 nm/min, and a thickness was set to 58 nm.

Next, a low reflective layer was formed on the absorber layer by the magnetron sputtering method.

The low reflective layer was a TaON layer, and the magnetron sputtering was performed by using a Ta target under an atmosphere of mixed gas of Ar, $O_2$ and $N_2$ (Ar=60 vol %, $O_2$=30 vol %, and $N_2$=10 vol %). A deposition rate was set to 1.32 nm/min. A thickness of the low reflective layer was set to 2 nm.

Accordingly, the reflective mask blank in this Case 1 was manufactured.

Flatness of the manufactured reflective mask blank was measured by use of a flatness measuring device manufactured by Fujinon Corporation. The flatness was 118 nm, and the reflective mask blank had a convex shape on the side where the reflective layer was formed.

(Case 2)

A CrO film was formed as the stress compensation layer 31 on one surface side of the substrate 20 by use of a magnetron sputtering method. The deposition conditions for the stress compensation layer 31 (CrO film) are as follows.
  Target: Cr target
  Sputtering Gas: mixed gas of Ar and $O_2$ (gas flow (Ar/$O_2$): 35/20 (sccm), gas pressure: 0.3 Pa)
  Input Power: 700 W
  Deposition Rate: 0.101 nm/sec
  Film Thickness: 14 nm Next, a CrN film was formed as the conductive layer 32 on the stress compensation layer 31 by use of the magnetron sputtering method, thereby forming the backside conductive film 30. The deposition conditions for the conductive layer 32 (CrN film) are as follows.
  Target: Cr target
  Sputtering Gas: mixed gas of Ar and $N_2$ (gas flow (Ar/$N_2$): 30/10 (sccm), gas pressure: 0.23 Pa)
  Input Power: 700 W
  Deposition Rate: 0.065 nm/sec
  Film Thickness: 14 nm The stress compensation layer 31 and the backside conductive film 30 in the Case 2 were evaluated in the same procedures as in the Case 1, and the results were shown in Table 1 and Table 2.

As a result of the flatness of the reflective mask blank obtained in the same procedures as in the Case 1, the flatness was 1,160 nm and the reflective mask blank had a convex shape on the side where the reflective layer was formed.

(Case 3)

The backside conductive film 30 was formed by performing the same procedures as in the Case 2 except that the thickness of the stress compensation layer 31 (CrO film) was 30 nm and the thickness of the conductive layer 32 (CrN film) was 40 nm.

The stress compensation layer 31 and the backside conductive film 30 in the Case 3 were evaluated in the same procedures as in the Case 1, and the results were shown in Table 1 and Table 2.

As a result of the flatness of the reflective mask blank obtained in the same procedures as in the Case 1, the flatness was 1,110 nm and the reflective mask blank had a convex shape on the side where the reflective layer was formed.

(Case 4)

A SnON film was formed as the stress compensation layer 31 on one surface side of the substrate 20 by use of a magnetron sputtering method. The deposition conditions for the stress compensation layer 31 (SnON film) are as follows.
  Target: Sn target
  Sputtering Gas: mixed gas of Ar, $O_2$ and $N_2$ (gas flow (Ar/$O_2$/$N_2$): 14/27/7 (sccm), gas pressure: 0.18 Pa)
  Input Power: 450 W
  Deposition Rate: 0.111 nm/sec
  Film Thickness: 175 nm Next, a CrN film was formed as the conductive layer 32 on the stress compensation layer 31 by use of a magnetron sputtering method, thereby forming the backside conductive film 30. The deposition conditions for the conductive layer 32 (CrN film) are as follows.
  Target: Cr target
  Sputtering Gas: mixed gas of Ar and $N_2$ (gas flow (Ar/$N_2$): 30/10 (sccm), gas pressure: 0.23 Pa)
  Input Power: 700 W
  Deposition Rate: 0.065 nm/sec
  Film Thickness: 13 nm The stress compensation layer 31 and the backside conductive film 30 in the Case 4 were evaluated in the same procedures as in the Case 1, and the results were shown in Table 1 and Table 2.

As a result of the flatness of the reflective mask blank obtained in the same procedures as in the Case 1, the flatness was 129 nm and the reflective mask blank had a convex shape on the side where the reflective layer was formed.

(Case 5)

A TaON film was formed as the stress compensation layer 31 on one surface side of the substrate 20 by use of a magnetron sputtering method. The deposition conditions for the stress compensation layer 31 (TaON film) are as follows.
  Target: Ta target
  Sputtering Gas: mixed gas of Ar, $O_2$ and $N_2$ (gas flow (Ar/$O_2$/$N_2$): 43/32/12 (sccm), gas pressure: 0.29 Pa)
  Input Power: 450 W
  Deposition Rate: 0.028 nm/sec
  Film Thickness: 550 nm Next, a CrN film was formed as the conductive layer 32 on the stress compensation layer 31 in the same procedures as in the Case 4, thereby forming the backside conductive film 30.

The stress compensation layer 31 and the backside conductive film 30 in the Case 5 were evaluated in the same procedures as in the Case 1, and the results were shown in Table 1 and Table 2.

As a result of the flatness of the reflective mask blank obtained in the same procedures as in the Case 1, the flatness was 102 nm and the reflective mask blank had a convex shape on the side where the reflective layer was formed.
(Case 6)

A $ZrO_2$ film was formed as the stress compensation layer 31 on one surface side of the substrate 20 by use of a magnetron sputtering method. The deposition conditions for the stress compensation layer 31 ($ZrO_2$ film) are as follows.

Target: Zr target
Sputtering Gas: mixed gas of Ar and $O_2$ (gas flow (Ar/$O_2$): 37/11 (sccm), gas pressure: 0.26 Pa)
Input Power: 700 W
Deposition Rate: 0.038 nm/sec
Film Thickness: 155 nm Next, a CrN film was formed as the conductive layer 32 on the stress compensation layer 31 in the same procedures as in the Case 4, thereby forming the backside conductive film 30.

The stress compensation layer 31 and the backside conductive film 30 in the Case 6 were evaluated in the same procedures as in the Case 1, and the results were shown in Table 1 and Table 2.

As a result of the flatness of the reflective mask blank obtained in the same procedures as in the Case 1, the flatness was 350 nm and the reflective mask blank had a convex shape on the side where the reflective layer was formed.
(Case 7)

A SiON film was formed as the stress compensation layer 31 on one surface side of the substrate 20 by use of a magnetron sputtering method. The deposition conditions for the stress compensation layer 31 (SiON film) are as follows.

Target: Si target
Sputtering Gas: mixed gas of Ar, $O_2$ and $N_2$ (gas flow (Ar/$O_2$/$N_2$): 24/2/22 (sccm), gas pressure: 0.19 Pa)
Input Power: 700 W
Deposition Rate: 0.032 nm/sec
Film Thickness: 690 nm Next, a CrN film was formed as the conductive layer 32 on the stress compensation layer 31 in the same procedures as in the Case 4, thereby forming the backside conductive film 30.

The stress compensation layer 31 and the backside conductive film 30 in the Case 7 were evaluated in the same procedures as in the Case 1, and the results were shown in Table 1 and Table 2.

As a result of the flatness of the reflective mask blank obtained in the same procedures as in the Case 1, the flatness was −86 nm and the reflective mask bland had a concave shape on the side where the reflective layer was formed.

TABLE 1

| | Film constitution Backside conductive film | | Optical properties | | | | | | | | | | |
| --- | --- | --- | --- | --- | --- | --- | --- | --- | --- | --- | --- | --- | --- |
| | Element contained in stress compensation layer | Element contained in conductive layer | Stress compensation layer | | | | | | Conductive layer | | Backside conductive film + glass substrate | | |
| | | | n400 | n532 | n800 | k400 | k532 | k800 | n532 | k532 | T400 [%] | T532 [%] | T800 [%] |
| Case 1 | | CrN | 1.86 | 2.71 | 4.04 | 3.4E+00 | 4.3E+00 | 5.0E+00 | | | 0.0 | 0.0 | 0.0 |
| Case 2 | CrO | CrN | 2.43 | 2.40 | 2.39 | 5.0E−01 | 3.3E−01 | 2.3E−01 | 2.6E+00 | 3.2E+00 | 14.4 | 16.8 | 20.9 |
| Case 3 | CrO | CrN | 2.43 | 2.40 | 2.39 | 5.0E−01 | 3.3E−01 | 2.3E−01 | 2.6E+00 | 3.2E+00 | 1.2 | 2.5 | 4.2 |
| Case 4 | SnON | CrN | 2.23 | 2.10 | 2.04 | 2.9E−02 | 4.3E−05 | 0.0E+00 | 2.6E+00 | 3.2E+00 | 13.4 | 20.0 | 20.4 |
| Case 5 | TaON | CrN | 2.23 | 2.15 | 2.10 | 0.0E+00 | 0.0E+00 | 0.0E+00 | 2.6E+00 | 3.2E+00 | 15.6 | 19.9 | 20.8 |
| Case 6 | $ZrO_2$ | CrN | 2.28 | 2.21 | 2.16 | 0.0E+00 | 0.0E+00 | 0.0E+00 | 2.6E+00 | 3.2E+00 | 15.5 | 19.9 | 20.4 |
| Case 7 | SiON | CrN | 1.76 | 1.73 | 1.72 | 5.3E−06 | 0.0E+00 | 0.0E+00 | 2.6E+00 | 3.2E+00 | 16.2 | 18.6 | 20.4 |

TABLE 2

| | Film constitution Backside conductive film | | Sheet resistance | Stress | | | | | Flatness |
| --- | --- | --- | --- | --- | --- | --- | --- | --- | --- |
| | Element contained in stress compensation layer | Element contained in conductive layer | Backside conductive film | Stress compensation layer | | Conductive layer | | Backside conductive film | Reflective mask blank |
| | | | Rs [Ω/square] | Thickness [nm] | Stress [MPa] | Thickness [nm] | Stress [MPa] | Total stress [Pa · m] | Flatness [nm] |
| Case 1 | | CrN | 5 | 345 | −600 | | | −207.0 | 118 |
| Case 2 | CrO | CrN | 113 | 14 | −200 | 14 | −289 | −6.8 | 1160 |
| Case 3 | CrO | CrN | 40 | 30 | −200 | 40 | −289 | −17.6 | 1110 |
| Case 4 | SnON | CrN | 115 | 175 | −1150 | 13 | −289 | −205.0 | 129 |
| Case 5 | TaON | CrN | 115 | 550 | −375 | 13 | −289 | −210.0 | 102 |
| Case 6 | $ZrO_2$ | CrN | 115 | 155 | −1025 | 13 | −289 | −162.6 | 350 |
| Case 7 | SiON | CrN | 115 | 690 | −351 | 13 | −289 | −245.9 | −86 |

Figure 2:
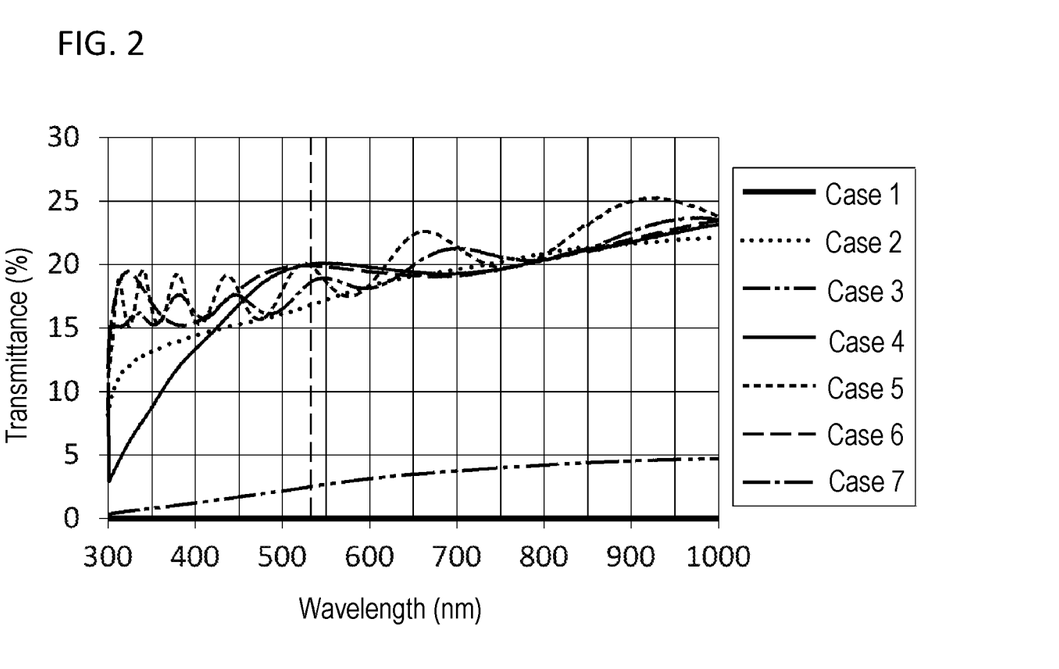
FIG. 2 is a graph showing the relationship between wavelengths and transmittance in Cases 1 to 7.

The relationship between the wavelength and transmittance in the Cases 1 to 7 was shown in FIG. 2.

In the Case 1 in which only the CrN film was formed as the backside conductive layer, the sheet resistance value was low, but the transmittance over the wavelength range of 400 nm to 800 nm was 0%. In the Case 2 in which the CrO film was formed as the stress compensation layer and the CrN film was formed as the conductive layer, but the total thickness of the backside conductive film was less than 50 nm, the total stress of the backside conductive film was small and the flatness of the reflective mask blank was high. In the Case 3 in which the CrO film was formed as the stress compensation layer and the CrN film was formed as the conductive layer, but the thickness of the conductive layer exceeds 30 nm, the transmittance over the wavelength range of 400 nm to 800 nm was less than 10%. Further, the total stress of the backside conductive film was small and the flatness of the reflective mask blank was high.

In contrast, in each of the Cases 4 to 7, the sheet resistances value were low, the transmittance over the wavelength range of 400 nm to 800 nm was high, and the flatness of the reflective mask blank can be lowered by the total stress of the backside conductive film. From the Cases 4 and 6, it is found that these properties were able to be exhibited even when the thickness of the stress compensation layer was small. From the comparison of the Case 4 with the Case 6, it is found the deposition rate of the stress compensation layer in the Case 4 is about three times faster than that in the Case 6 and the Case 4 is more preferred than the Case 6.

While the present invention has been described in detail and with reference to specific embodiments thereof, it will be apparent to one skilled in the art that various changes and modifications can be made therein without departing from the spirit and scope thereof.

This application is based on Japanese Patent Application No. 2017-156756 filed on Aug. 15, 2017, the entire subject matters of which are incorporated herein by reference.

DESCRIPTION OF REFERENCE NUMERALS AND SIGNS

10 Reflective mask blank
20 Substrate
30 Backside conductive film
31 Stress compensation layer
32 Conductive layer
40 Reflective layer (multilayer reflective film)
50 Absorber layer

The invention claimed is:

1. A reflective mask blank, comprising: a backside conductive film on a back surface of a substrate, wherein the backside conductive film has a laminated structure comprising:

a stress compensation layer; and
a conductive layer;
in this order from the substrate side,
wherein
the conductive layer comprises a metal nitride,
the stress compensation layer has a compressive stress,
the stress compensation layer comprises at least one compound selected from the group consisting of oxides of Sn, Zr, Zn, Ti, Nb and Al, oxynitrides of Sn, Zr, Zn, Ti, Nb and Al, and nitrides of Sn, Zr, Zn, Ti Nb and Al, each having an absorption coefficient (k) over the wavelength range of 400 nm to 800 nm being 0.1 or less,
the metal nitride in the conductive layer comprises at least one element selected from the group consisting of Cr, Ti, Zr, and Nb,
the conductive layer has a thickness of 5 nm or more and 30 nm or less, and has a different composition than the stress compensation layer, and
the backside conductive film has a total thickness of from 100 nm to 600 nm.

2. The reflective mask blank according to claim 1, wherein the backside conductive film has a compressive stress with a total stress of 50 Pa·m to 400 Pa·m.

3. The reflective mask blank according to claim 1, wherein the stress compensation layer has a compressive stress with a film internal stress per unit film thickness of 300 MPa to 2,000 MPa.

4. The reflective mask blank according to claim 1, wherein the stress compensation layer has a refractive index (n) over the wavelength range of 400 nm to 800 nm of 1.7 or more.

5. The reflective mask blank according to claim 1, wherein the conductive layer has a refractive index (n) at a wavelength of 532 nm of 3.5 or less and an absorption coefficient at a wavelength of 532 nm of 4.0 or less.

6. The reflective mask blank according to claim 1, wherein the backside conductive film has a sheet resistance (Rs) of 250 Ω/square or less.

7. The reflective mask blank according to claim 1, wherein the backside conductive film has transmittance over the wavelength range of 400 nm to 800 nm of 10% or more.

8. The reflective mask blank according to claim 1, which comprises a reflective layer which reflects EUV light and an absorber layer which absorbs EUV light on/above a front surface of the substrate in this order from the substrate side.

9. A reflective mask obtained by forming a pattern in the absorber layer of the reflective mask blank according to claim 8.

* * * * *